(12) United States Patent
Kangas et al.

(10) Patent No.: US 7,684,834 B2
(45) Date of Patent: Mar. 23, 2010

(54) METHOD OF MONITORING BATTERY CHARACTERISTICS AND RADIO TERMINAL EQUIPMENT

(75) Inventors: Petri Juhani Kangas, Oulu (FI); Jyrki Hoisko, Oulu (FI)

(73) Assignee: Nokia Corporation, Espoo (FI)

( * ) Notice: Subject to any disclaimer, the term of this patent is extended or adjusted under 35 U.S.C. 154(b) by 1358 days.

(21) Appl. No.: 10/875,981

(22) Filed: Jun. 24, 2004

(65) Prior Publication Data

US 2005/0009577 A1 Jan. 13, 2005

(30) Foreign Application Priority Data

Jun. 27, 2003 (FI) .................................. 20030960

(51) Int. Cl.
*H04M 1/00* (2006.01)
(52) U.S. Cl. ..................... 455/574; 455/343.2; 370/311
(58) Field of Classification Search ................ 455/572, 455/573, 574, 566, 41.2, 41.3, 507, 517, 455/343.1, 343.2
See application file for complete search history.

(56) References Cited

U.S. PATENT DOCUMENTS

| 5,680,112 A | 10/1997 | Xydis |
| 6,084,523 A | 7/2000 | Gelnovatch et al. |
| 6,263,200 B1 * | 7/2001 | Fujimoto ................. 455/343.5 |
| 6,549,774 B1 * | 4/2003 | Titlebaum et al. ........... 455/427 |
| 6,749,122 B1 * | 6/2004 | Koenck et al. ......... 235/472.02 |
| 2002/0045424 A1 * | 4/2002 | Lee ............................. 455/41 |
| 2003/0122671 A1 * | 7/2003 | Jespersen ................. 340/568.1 |
| 2003/0124979 A1 * | 7/2003 | Tanada et al. ................. 455/41 |
| 2003/0207699 A1 * | 11/2003 | Shpak ......................... 455/525 |
| 2004/0044774 A1 * | 3/2004 | Mangalik et al. ............ 709/227 |
| 2004/0057507 A1 * | 3/2004 | Rotstein et al. ............. 375/219 |
| 2004/0070615 A1 * | 4/2004 | Ewing et al. ................ 345/764 |
| 2004/0203363 A1 * | 10/2004 | Carlton et al. ............. 455/41.2 |

FOREIGN PATENT DOCUMENTS

JP 2002290320 4/2002

* cited by examiner

*Primary Examiner*—Nhan T Le
(74) *Attorney, Agent, or Firm*—Hollingsworth & Funk, LLC (57) ABSTRACT

The invention relates to a method of monitoring battery characteristics in a radio terminal equipment arrangement. The method comprises measuring battery characteristics of a battery of one or more secondary units communicating with radio terminal equipment; establishing a low-power radio frequency (LPRF) connection between radio terminal equipment and a secondary unit of the radio terminal equipment arrangement. The method also comprises receiving, in the radio terminal equipment, the measured battery characteristics of the one or more secondary units via the established LPRF connection; and giving an indication, by the radio terminal equipment, relating to the battery characteristics of the one or more secondary units.

40 Claims, 4 Drawing Sheets

METHOD OF MONITORING BATTERY CHARACTERISTICS AND RADIO TERMINAL EQUIPMENT

FIELD

The invention relates to a method of monitoring battery characteristics in a radio terminal equipment arrangement and to radio terminal equipment.

BACKGROUND

Mobile devices divided into several parts that are used in various combinations are being developed. Multipart radio terminals, for example, may include a cellular core unit and a number of optimized peripheral units. The peripheral units of the multipart radio terminals are optimized for specific tasks and all the peripheral units are connected to a core unit by low-power radio frequency (LPRF) connections, such as Bluetooth connections. One of the peripheral units may be optimized for making basic phone calls and another peripheral unit may be optimized for messaging and browsing or for imaging and music, for example. Typical mobile phones may also comprise several enhancement devices, such as headsets, pens, and web pads that communicate with the mobile phone over wireless connections.

All the peripheral units of a multipart radio terminal or enhancement devices of a mobile phone, for example, have different kinds of power consumption characteristics, that is, standby times and operation times, for example. These affect their individual average usage times between battery charges. A problem is that the user of the device has to constantly charge some devices or peripheral units and actively observe the battery statuses of several devices so that the whole set of devices remains operational. This creates inconvenience to the user.

Even if all the devices of the arrangement had equally long average use times, the compound use time of the whole system would be significantly less than with a system including one device alone. This is due to multiple devices running out of battery at random times in relation to each other. This phenomenon is familiar from the concept of MTBF (Mean Time Between Failures) in electronic components: one component can last a certain amount of time but if you connect two of them in sequence, the compound reliability of the system drops.

BRIEF DESCRIPTION OF THE INVENTION

An object of the invention is to provide an improved method of monitoring battery characteristics and improved radio terminal equipment. According to an aspect of the invention, there is provided a method of monitoring battery characteristics in radio terminal equipment arrangement, the method comprising: measuring battery characteristics of a battery of one or more secondary units communicating with radio terminal equipment; establishing a low-power radio frequency (LPRF) connection between radio terminal equipment and a secondary unit of the radio terminal equipment arrangement. The method of the invention comprises receiving, in the radio terminal equipment, the measured battery characteristics of the one or more secondary units via the established LPRF connection; and giving an indication, by the radio terminal equipment, relating to the battery characteristics of the one or more secondary units.

According to another aspect of the invention, there is provided radio terminal equipment comprising a control unit for controlling the functions of the radio terminal equipment, the radio terminal equipment being configured to communicate with one or more secondary units by using wireless low-power radio frequency (LPRF) connections, and the one or more secondary units being configured to measure battery characteristics of batteries of the one or more secondary units. The control unit of the radio terminal equipment being further configured to: receive the measured battery characteristics of the one or more secondary units via the LPRF connection; and give an indication relating to the battery characteristics of the batteries of the one or more secondary units in the radio terminal equipment.

Preferred embodiments of the invention are described in the dependent claims.

The method and radio terminal equipment of the invention provide several advantages. In an embodiment of the invention, the battery characteristics of each separate device may be easily observed at the same time. The monitoring of the battery characteristics becomes simple. There is no need to constantly monitor all batteries of the devices being used by the user. The battery characteristics of all the devices the user wishes to use can be easily observed with only one device.

LIST OF DRAWINGS

In the following, the invention will be described in greater detail with reference to the preferred embodiments and the accompanying drawings, in which.

DESCRIPTION OF THE EMBODIMENTS

Figure 1:
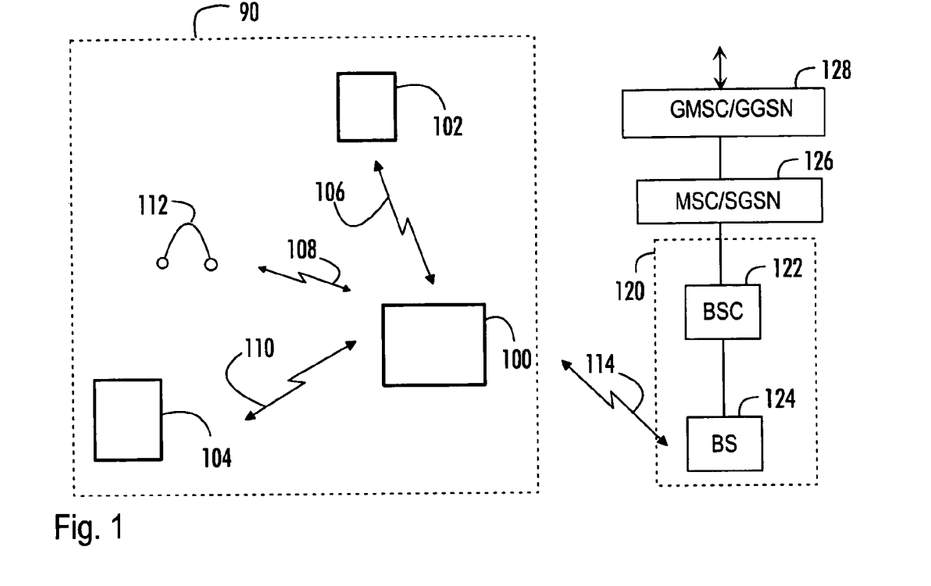
FIG. 1 shows an example of a structure of a radio system.

With reference to FIG. 1, let us examine an example of a radio system to which the preferred embodiments of the invention can be applied. The radio system can be based on, for example, GSM (Global System for Mobile Communications), WCDMA (Wideband Code Division Multiple Access) or CDMA (Code Division Multiple Access).

A radio terminal equipment arrangement 90 in FIG. 1 comprises radio terminal equipment 100 and a number of secondary units 102, 104, 112. The radio terminal equipment arrangement 90 is a multipart radio terminal, for example. The radio terminal equipment 100, on the other hand, may be a core unit of the multipart radio terminal, a typical mobile phone or a PDA (Personal Digital Assistant), for example. The secondary unit 102, 104, 112 may be another mobile phone or any accessory device that is used with the mobile phone, such as a headset 112, a webpad, a wireless pen, a PDA device or a heart rate monitor. If the radio terminal equipment arrangement 90 is a multipart radio terminal, then, the secondary units 102, 104, 112 may be peripheral units communicating with the multipart radio terminal.

A cellular network may correspond to the combined structure of the GSM (Global System for Mobile Communications) and GPRS (General Packet Radio Service) systems, for example. The GSM network elements are responsible for the implementation of circuit-switched connections, and the GPRS network elements are responsible for the implementation of packet-switched connections, some of the network elements, however, being shared by both systems.

A centre 126 represents a mobile services switching centre (MSC) and a serving GPRS support node (SGSN) that enable circuit-switched and packet switched signalling, respectively, in the radio system. The cellular network may comprise a gateway unit 128, which is represented by a gateway mobile service switching centre (GMSC) and a gateway GPRS support node (GGSN). GMSC attends to the circuit-switched connections between the cellular network and external networks, such as a public land mobile network (PLMN) or a public switched telephone network (PSTN), and GGSN attends to the packet-switched connections between the cellular network and external networks, such as the Internet.

The centre 126 controls a radio access network (RAN) 120, which may comprise at least one base station controller 122 controlling at least one base station 124. The base station controller 122 can also be called a radio network controller, and the base station 124 can be called a node B. The radio terminal equipment 100 of the radio terminal equipment arrangement 90 may communicate with at least one base station 124 over a radio interface The secondary units 102, 104, 112 in the radio terminal equipment arrangement 90 may be optimized for specific tasks. One of the secondary units is optimized for making basic phone calls and another secondary unit is optimized for messaging and browsing or for image processing and music, for example. Data may be stored in the secondary unit's own databases. The secondary units 102, 104, 112 communicate with the radio terminal equipment 100 with low-power radio frequency (LPRF) connections 106, 108, 110, such as Bluetooth or WLAN (Wireless Local Area Network) connections. The radio terminal equipment 100, on the other hand, is configured to communicate with other systems, such as the Internet, for example with LPRF connections and with GSM/GPRS/EDGE connections 114 as well. It is possible that the secondary units 102, 104 also communicate with other systems with GSM/GPRS/EDGE connections, for example. It is also possible that the secondary units 102, 104 are configured to establish outside LPRF connections, such as WLAN connections, to other systems. Also, the radio terminal equipment 100 may establish connections between the secondary units 102, 104 and other systems, such as the Internet or other radio terminals, via a cellular network by using a GSM or a GPRS/EDGE connection 114, for example.

Figure 2:
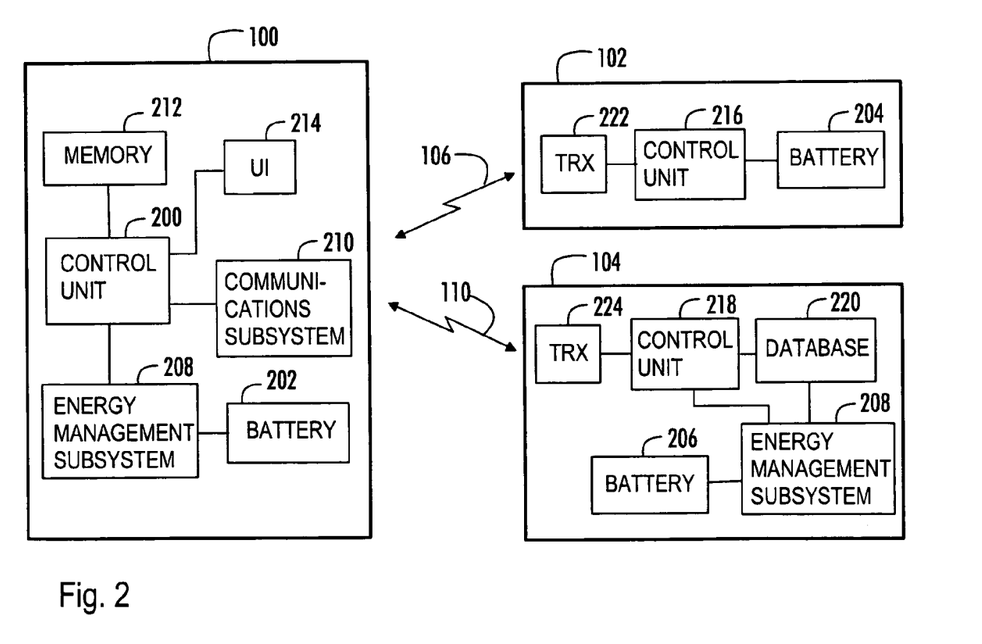
FIG. 2 shows an example of the structures of radio terminal equipment and secondary units.

The present solution is generally described in FIG. 2. In the present solution, the radio terminal equipment 100 comprises at least a control unit 200 for controlling the functions of the radio terminal equipment 100, and the radio terminal equipment 100 is configured to communicate with one or more secondary units 102, 104 by using wireless low-power radio frequency (LPRF) connections 106, 110. The one or more secondary units 102, 104 are configured to measure battery characteristics of batteries 204, 206 of the one or more secondary units 102, 104. In the present solution, the control unit 200 of the radio terminal equipment 100 is further configured to receive the measured battery characteristics of the one or more secondary units 102, 104 via the LPRF connection and to give an indication relating to the battery characteristics of the batteries 204, 206 of the one or more secondary units 102, 104 in the radio terminal equipment 100.

The radio terminal equipment 100 may also comprise the following elements: a battery 202, an energy management subsystem 208, a memory 212, a communications subsystem 210, and a user interface 214. The secondary units 102, 104 may comprise transmitter-receivers 222, 224 for communicating with the radio terminal equipment 100, control units 216, 218 for controlling the functions of the secondary units 102, 104, energy management subsystems 208, and databases 220 for storing different data, such as data on the battery characteristics.

The control units 200, 216, 218 of the radio terminal equipment 100 and the secondary units 102, 104 refer to blocks controlling the operation of the devices, and are nowadays usually implemented as a processor and software, but different hardware implementations are also feasible, e.g. a circuit built of separate logics components or one or more client-specific integrated circuits (Application-Specific Integrated Circuit, ASIC). A hybrid of these implementations is also feasible. The batteries 202, 204, 206 are rechargeable batteries, for example, and are used as a source of electric energy for the radio terminal equipment 100 and the secondary units 102, 104. The energy management subsystem 208 controls the operation of the batteries. The communications subsystem 210 controls the communication of the radio terminal equipment 100. The user interface 214 of the radio terminal equipment 100 is an interface via which the user can interact with the software of the radio terminal equipment 100 and with the secondary units 102, 104 as well. The user interface 214 may comprise a display. In addition, the user interface 214 may include a loudspeaker and a keypad part. Depending on the type of device, there may be different user interface parts and a varying number of them.

In an embodiment, the battery characteristics data that is received in the radio terminal equipment 100 may be stored in the memory 212 of the radio terminal equipment 100. It is possible that the radio terminal equipment 100 receives the battery characteristics from the secondary units 102, 104 periodically and then updates the battery characteristics data stored in the memory 212 regularly. Based on the stored battery characteristics, the control unit 200 of the radio terminal equipment 100 may be configured to calculate battery endurance predictions or any other calculations of interest. Thus, the indication relating to the battery characteristics given on the display of the radio terminal equipment 100, for example, may comprise data on the battery energy level, the battery status, duration of the battery, or recharging times. The battery characteristics indication may be given in the form of a visual presentation, a sound indication, a vibration, or any combination thereof, for example.

The control unit 200 of the radio terminal equipment 100 is configured to select in advance the one or more secondary units 102, 104, of which the indication relating to the battery characteristics is to be given. Thus, the user of the radio terminal equipment 100 may easily monitor battery characteristics, for example, of only the secondary units 102, 104 of current interest.

In an embodiment, if the LPRF connection 106, 110 to a secondary unit 102, 104 cannot be established, the control unit 200 is configured to activate an indication concerning the missing LPRF connection between the radio terminal equipment 100 and the secondary unit 102, 104. The above situation is possible, for example, if a secondary unit 102, 104 has moved out of range of the radio terminal equipment 100.

Figure 3:
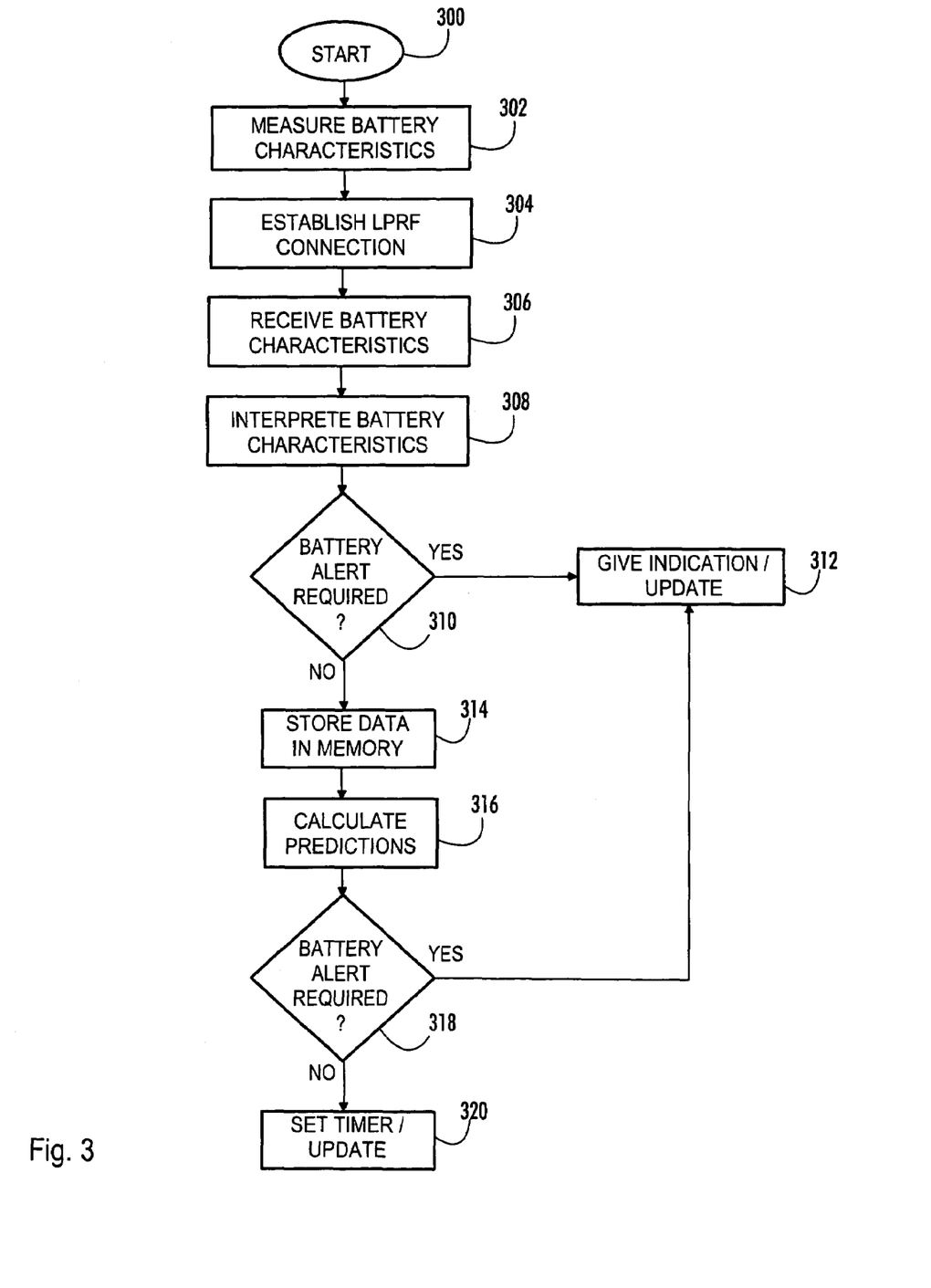
FIG. 3 shows an example of a method of monitoring battery characteristics in a radio terminal equipment arrangement.

FIG. 3 shows an example of a method of monitoring battery characteristics in a radio terminal equipment arrangement. The method starts in 300. In 302, the battery characteristics of a battery of one or more secondary units are measured. In 304, the LPRF connection between the radio terminal equipment and the secondary unit is established. The LPRF connection may be established by the radio terminal equipment or by the secondary unit. In an embodiment, it is possible that it is detected in a secondary unit that the energy level of the battery is in a predetermined range, for example too low, and based on the detection, the battery characteristics are sent to the radio terminal equipment via the LPRF connection.

In 306, the battery characteristics are received in the radio terminal equipment. It is possible that the secondary units send the battery characteristics regularly or that the radio terminal equipment requests the battery characteristics when needed. Next, in 308, the received battery characteristics are interpreted in the radio terminal equipment. The radio terminal equipment may check, if the battery energy level is in an acceptable range, for example. If, in 310, it is detected that a battery alert should be given, then the routine proceeds to 312. The battery alert may be needed if the battery energy level is too low and the battery needs to be recharged, for example. Another reason for the battery alert could be if, for some reason, the radio terminal equipment cannot receive the battery characteristics data from the secondary unit. The secondary unit may be out of range of a Bluetooth connection, for example.

In 312, an indication relating to the battery characteristics of the one or more secondary units is given. If the battery indication is already displayed on a display of the radio terminal equipment, for example, then it is possible that the data relating to the battery characteristics is updated here. The indication is a visual presentation on the display of the radio terminal equipment, for example. Also, a sound signal may be given at the same time to indicate about a low battery level, for example.

In 314, data relating to the battery characteristics is stored in the memory of the radio terminal equipment. It is possible that in the memory of the radio terminal equipment previously received data on the battery characteristics is also stored. In 316, the radio terminal equipment calculates predictions based on the received battery characteristics and previously received data on the battery characteristics. The radio terminal equipment calculates battery endurance predictions, for example. In 318, if it is detected that the calculated battery endurance prediction for one or more secondary units is critical, the routine proceeds to 312. The prediction may be critical, for example, if it is detected that the energy level of a battery is dropping below a predetermined level or is soon going to be too low in the prevailing conditions.

In 320, the radio terminal equipment may update the data on the battery characteristics. Further, a timer may be set.

Figure 4:
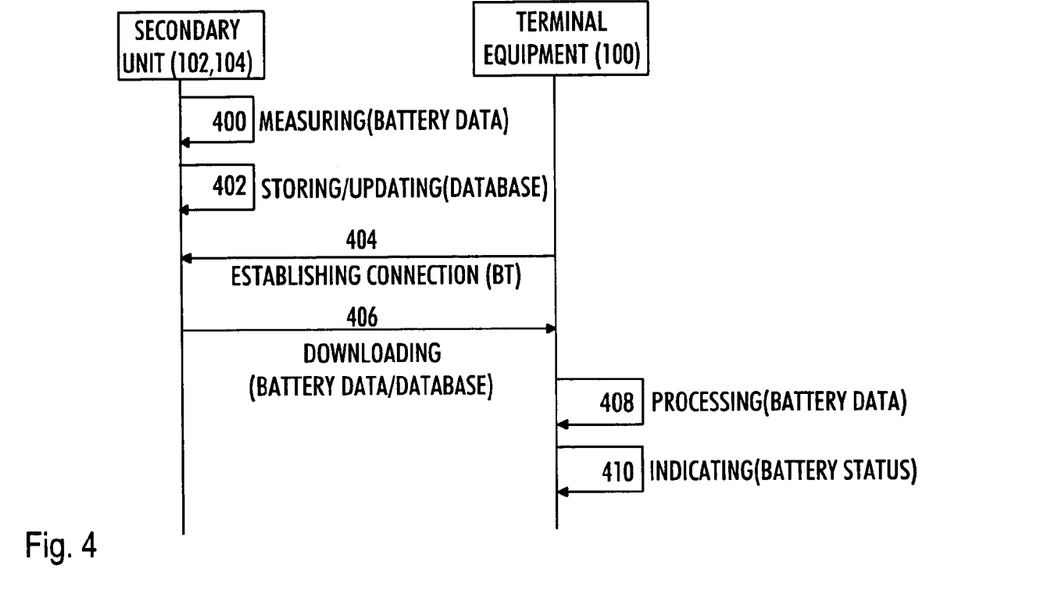
FIGS. 4 and 5 are signal sequence diagrams illustrating the method of monitoring battery characteristics in a radio terminal equipment arrangement.

FIG. 4 is a signal sequence diagram illustrating the method of monitoring battery characteristics in a radio terminal equipment arrangement. The first vertical line SECONDARY UNIT (102, 104) denotes communication originating from and terminating in one or more secondary units. The second vertical line TERMINAL EQUIPMENT (100) denotes communication of the radio terminal equipment and measures taken in the device.

In 400, the battery characteristics are measured in the secondary unit. In an embodiment, in 402, the measured battery characteristics are stored or updated in a database of the secondary unit. The database may be a Bluetooth Service Discovery database that is used by Bluetooth devices to exchange information about their capabilities. When an inquiry is executed by the radio terminal equipment, that is, new secondary units are searched for, the devices carry out a Bluetooth Service Discovery which downloads service discovery records from the Bluetooth device (secondary units) to which the radio terminal equipment is connected. A power status may be one of these Service Records, and the power status could be in the attributes of the Service Discovery Record. Thus, the secondary unit only has to add a new record and update the parameter when battery-status changes to its Bluetooth Service Discovery Database are required, and no additional communication or protocol handling is needed.

In 404, the radio terminal equipment establishes the Bluetooth connection to the secondary unit and in 406, the radio terminal equipment downloads the battery characteristics from the database, such as the Service Discovery Database. This is a simple method to implement battery characteristics exchange because no changes are needed for the secondary unit's Bluetooth module.

In an embodiment, a Bluetooth profile may be used for receiving the battery characteristics of the one or more secondary units. For example, a power control profile may be created that describes a standard way in which the radio terminal equipment and the secondary units may exchange the battery characteristics information and access each other's power saving attributes, for example. Thus, the exchange of the battery characteristics is done within this profile and a proprietary protocol is used for delivering information between the devices. The protocol may be a simple ASCII (American Standard Code for Information Interchange) or XML (Extensible Markup Language) based text information carried on top of an L2CAP (Logical Link Control and Adaptation Layer Protocol) Bluetooth layer.

In 408, the downloaded data related to battery characteristics is processed in the radio terminal equipment. For example, the battery endurance predictions may be calculated. Next, in 410, the indication of the battery characteristics is given in the radio terminal equipment.

Figure 5:
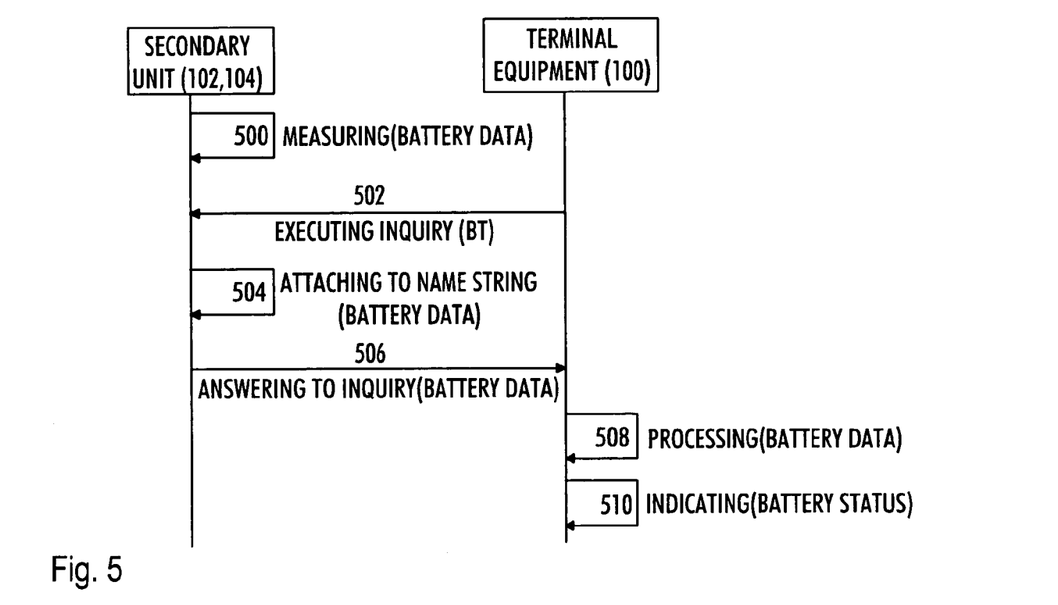

FIG. 5 is a signal sequence diagram illustrating the method of monitoring battery characteristics in a radio terminal equipment arrangement. The first vertical line SECONDARY UNIT (102, 104) denotes communication originating from and terminating in one or more secondary units. The second vertical line TERMINAL EQUIPMENT (100) denotes communication of the radio terminal equipment and measures taken in the device.

In this example, a Bluetooth Inquiry is used for exchanging the battery characteristics data between the radio terminal equipment and the secondary unit. When searching for other devices, the Bluetooth device first makes an Inquiry. In the Inquiry, the other devices return their MAC (message authentication code) addresses and their respective names using a Link Manager Protocol (LMP) to access a User_Friendly_Name. The battery characteristics may be embedded within the User_Friendly_Name string, for example. The battery characteristics may then be provided for an application that keeps track of the user's devices and their status. In the Inquiry, the Link Manager Protocol is used to fetch the name. The MAC address and the User_Friendly_Name may be fetched using a LMP_name_req-message, for example.

In 500, the battery characteristics are measured in the secondary unit. Then, in 502, the radio terminal equipment executes the Bluetooth Inquiry for searching the one or more secondary units. In 504, the secondary unit attaches the battery characteristics data to the secondary unit's name string. Next, in 506, the secondary unit answers to the Inquiry by returning its respective name string, the name string comprising the measured battery characteristics data of the secondary unit. In 508, the radio terminal equipment processes the battery characteristics data that has been received within the respective name string of the secondary unit. Finally, in 510, the radio terminal equipment gives an indication relating to the battery characteristics.

In an embodiment, it is also feasible that in addition to the name information, some Service Class information (other than the Service Discovery Records) is retrieved. These bits of information may be used to indicate whether or not the battery of the secondary unit needs recharging.

In an embodiment, a Link Manager Protocol is used in exchanging the battery characteristics between the radio terminal equipment and the one or more secondary units. The Link Manager Protocol is responsible for link setup and control between the Bluetooth devices, including the control and negotiation of baseband packet sizes, security, generating link keys, etc. A new type of LMP PDU (Link Manager Protocol Packet Data Unit) message may be introduced, for example. In addition to 55 existing LMP PDU messages, a new message can be created, for example a LMP_battery_status. Alternatively, one of the existing types of LMP PDU messages may be used. The use of low-level LM protocol and LM messages provide a fast and power-aware solution for exchanging battery characteristics data. Like the Link Manager Protocol, the L2CAP protocol may also be used to carry the battery characteristics data by introducing a new type of message for the purpose.

Figure 6:
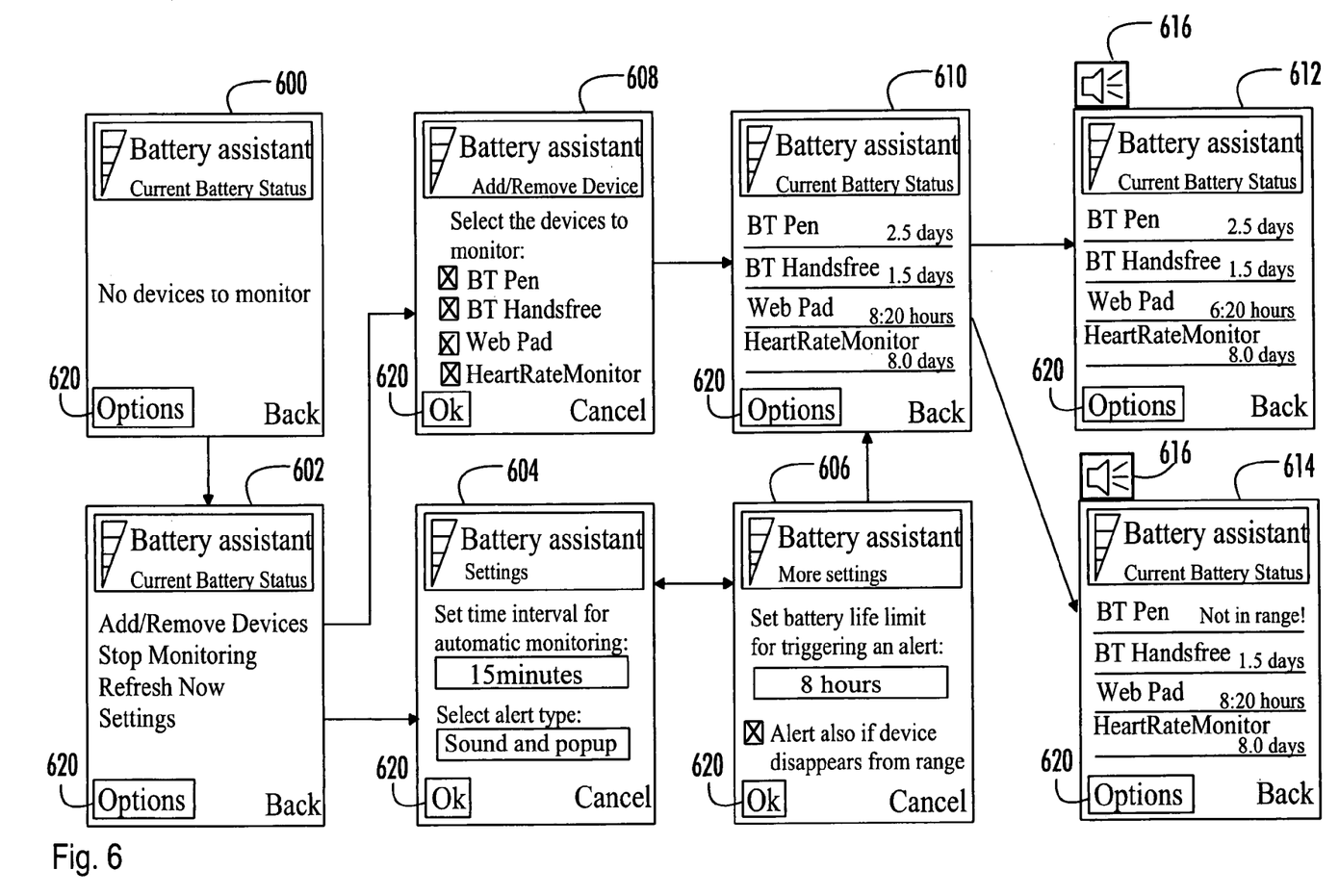
FIG. 6 shows details of a display of the radio terminal equipment of the invention.

FIG. 6 shows details of the display of the radio terminal equipment of the invention. Eight different display views 600-614 are shown in order to visualize the method of monitoring the battery characteristics in a radio terminal equipment arrangement. The application controlling the displayed view is called a battery assistant in this example. The arrows illustrate examples of the display views that may be entered from different display views. As the user of the radio terminal equipment wishes to monitor the battery characteristics of the devices in use, the battery assistant is turned on using the user interface of the radio terminal equipment, for example.

If there are no secondary units selected to monitor at the moment, display view 600 may be shown where it is indicated, for example, that there are no devices to monitor. The battery assistant may be visually shown as a small icon on the display and when the user wishes to monitor the details of the battery characteristics, the whole view of the battery assistant, such as a pop-up window, may be shown on the display. It is possible that the battery assistant feature turns automatically on when there are some critical changes on the battery characteristics of the monitored secondary units, for example.

Display view 602 shows an example of different actions that may be executed in the method. The user may have selected display view 602 by selecting 'Options' icon 620 while display view 600 was shown. In display view 602, the user is presented different measures that can be taken including: adding and removing devices to monitor, ending the monitoring, refreshing or adjusting settings of the battery assistant.

In the settings of the battery assistant, the user may set time intervals for automatic monitoring and select the alert types, for example. Display view 604 presents a settings window where the user has selected that the battery characteristics of the secondary units will be checked automatically every 15 minutes. The user may adjust the timer interval for automatic monitoring to a desired length or choose that no automatic monitoring is used, for example. As in display view 604, the alert type may be selected to include both sound and a popup window, that is, when the battery alert is activated, the radio terminal equipment signals a warning sound and the battery assistant popup window indicating the reason for the battery alert at the same time. The user may choose to select different alert types including sound, vibration, popup windows, or any combinations thereof.

In display view 606, more settings of the battery assistant are shown. The user may adjust the time when to activate the battery alert based on the remaining battery life of a secondary unit, for example. Also, if a secondary unit disappears from range, an additional alert can be set to activate.

In display view 608, it is shown how the user of the battery assistant may easily select the different secondary units, the battery characteristics of which need to be monitored. On the display, a list of all the secondary units connected to the radio terminal equipment may be shown. The user may then select from the list the interesting secondary units to monitor. In exemplary display view 608, the user has selected a Bluetooth pen, a Bluetooth hands-free device, a web pad, and a heart rate monitor, the battery characteristics of which are to be monitored.

In display view 610, an exemplary battery status-monitoring window is shown. The secondary units that have been selected are shown on the display and the battery endurance times are shown related to them. There may be various other pieces of data relating to the battery characteristics that are shown in the display views of the battery assistant. As for the radio terminal equipment's own battery status, it is possible that the battery status of the radio terminal equipment is shown with the battery status of the secondary units. The battery characteristics of the radio terminal equipment may also be shown in other ways, for example with a small visual presentation as in the upper left corners of the display views 600 to 614.

Display views 612 and 614 show situations where a battery alert may be activated. In display view 612, the battery of a web pad is causing a battery alert. The battery life limit for triggering a battery alert was set to 8 hours as shown in display view 606. Now it is detected in the radio terminal equipment that the battery of the web pad has only six hours and 20 minutes life time left. This activates the battery alert. The battery alert is given with a sound signal 616 and by showing the display view 612 as was set in display view 604. In display view 614, the radio terminal equipment has detected that the monitoring of the battery status of the Bluetooth pen has become impossible because the Bluetooth pen has moved out of range. Also here, the battery alert is given with a sound signal 616 and by showing display view 614.

Even though the invention is described above with reference to examples according to the accompanying drawings, it is clear that the invention is not restricted thereto but it can be modified in several ways within the scope of the appended claims.

The invention claimed is:

1. A method comprising:
   establishing a low-power radio frequency connection with one or more secondary units;
   receiving information related to battery characteristics of at least one of the one or more secondary units via the established low-power radio frequency connection;
   providing a visible or audio indication identifying, to a user, the battery characteristics associated with the one or more secondary units based on the received information; and
   storing and updating the battery characteristics in a memory of an apparatus that received the information relating to the battery characteristics of the at least one of the one or more secondary units.

2. The method of claim 1, the method further comprising detecting, by one or more secondary units, that energy level of the battery is in a predetermined range and sending, by the one or more secondary units, the battery characteristics based on the detection.

3. The method of claim 1, the method further comprising sending the battery characteristics periodically by the one or more secondary units.

4. The method of claim 1, wherein before receiving a measured battery characteristic, the method further comprises requesting the battery characteristics from the one or more secondary units.

5. The method of claim 1, wherein the indication relating to the battery characteristics comprises data on the battery energy level, the battery status, duration of the battery or recharging times.

6. The method of claim 1, wherein the indication relating to the battery characteristics is given in the form of a visual presentation on a display of an apparatus that received the information relating to the battery characteristics of the at least one of the one or more secondary units, a sound indication, a vibration, or any combination thereof.

7. The method of claim 1, the method further comprising calculating, by the apparatus, battery endurance predictions based on battery characteristics stored by the apparatus.

8. The method of claim 1, wherein the low-power radio frequency connection is a Bluetooth, an infrared, or a WLAN connection.

9. The method of claim 1, the method further comprising using a Bluetooth profile for receiving the battery characteristics of the one or more secondary units.

10. The method of claim 1, wherein Bluetooth Service Discovery is used for receiving the battery characteristics of the one or more secondary units by the battery characteristics of the one or more secondary units from a Service Discovery database maintained by each of the one or more secondary units.

11. The method of claim 1, wherein Bluetooth Inquiry is used for receiving measured battery characteristics of the one or more secondary units by
  making an inquiry for searching the one or more secondary units; and
  receiving from at least one of the one or more secondary units the measured battery characteristics within a respective name string of the at least one secondary unit when answering to the inquiry.

12. The method of claim 1, the method further comprising using a Link Manager Protocol for receiving measured battery characteristics.

13. The method of claim 1, the method further comprising selecting in advance the one or more secondary units, of which the indication relating to the battery characteristics is to be given by an apparatus that receives information relating to the battery characteristics of at least one of the one or more secondary units.

14. The method of claim 1, the method further comprising activating an indication, when a low-power radio frequency connection to one or more secondary units cannot be established.

15. The method of claim 1, wherein the apparatus and the one or more secondary units form a multipart radio terminal arrangement.

16. The method of claim 15, wherein a user interface of the apparatus provides a user interface for at least one of the one or more secondary units in response to limitations of a user interface of the one or more secondary units.

17. An apparatus comprising:
  a transceiver configured to communicate with one or more secondary units by using wireless low-power radio frequency (LPRF) connections, and a control unit configured to receive measured battery characteristics of the one or more secondary units via the LPRF connection, and provide an indication identifying the battery characteristics of the batteries of the one or more secondary units to at least one of a display or a loudspeaker for outputting said indication to a user, wherein the control unit is configured to use a Bluetooth Service Discovery for receiving the battery characteristics of the one or more secondary units, the Bluetooth Service Discovery comprising storing and updating, by the one or more secondary units, the measured battery characteristics in a Bluetooth Service Discovery Database; and downloading, by the apparatus, the battery characteristics from the Service Discovery Database.

18. The apparatus of claim 17, wherein the LPRF connection is a Bluetooth, infrared, or WLAN connection.

19. The apparatus of claim 17, wherein the control unit is configured to use a Bluetooth profile for receiving the battery characteristics of the one or more secondary units.

20. The apparatus of claim 17, wherein the control unit is configured to use a Bluetooth Inquiry for receiving the measured battery characteristics of the one or more secondary units, the Bluetooth Inquiry comprising making an inquiry, by the apparatus, for searching the one or more secondary units, and sending, by the one or more secondary units, the measured battery characteristics within a respective name string of the secondary unit, when answering to the inquiry of the apparatus.

21. The apparatus of claim 17, wherein the control unit of the apparatus is configured to use a Link Manager Protocol for receiving the measured battery characteristics.

22. The apparatus of claim 17, wherein the control unit is configured to give the indication relating to the battery characteristics in the form of a visual presentation, a sound indication, a vibration, or any combination thereof.

23. The apparatus of claim 17, wherein the control unit is configured to store and update the battery characteristics in a memory of the apparatus.

24. The apparatus of claim 23, wherein the control unit is configured to calculate battery endurance predictions based on battery characteristics stored by the apparatus.

25. The apparatus of claim 17, wherein the control unit is configured to select in advance the one or more secondary units, of which the indication relating to the battery characteristics is to be given by the apparatus.

26. The apparatus of claim 17, wherein the control unit is configured to activate an indication, when an LPRF connection to one or more secondary units cannot be established.

27. The apparatus of claim 17, wherein the apparatus and/or the one or more secondary units is a mobile station.

28. The apparatus of claim 17, wherein the apparatus and/or the one or more secondary units is a PDA (Personal Digital Assistant) device or a portable computer.

29. A method comprising:
  establishing a low-power radio frequency (LPRF) connection between a radio terminal equipment and at least one secondary unit;
  receiving, in the radio terminal equipment, information indicative of battery characteristics of the at least one secondary unit via the established LPRF connection, wherein Bluetooth Inquiry is used for receiving the measured battery characteristics of the at least one secondary unit, the Bluetooth Inquiry comprising:
    making an inquiry, by the radio terminal equipment, for searching the at least one secondary unit; and
    sending, by the at least one secondary unit, the measured battery characteristics within a respective name string of the secondary unit, when
  answering to the inquiry of the radio terminal equipment; and providing an indication, by the radio terminal equipment, relating to the battery characteristics of said at least one secondary unit.

30. The method of claim 29, wherein the indication relating to the battery characteristics comprises data on the battery energy level, the battery status, duration of the battery or recharging times.

31. The method of claim 29, wherein the indication relating to the battery characteristics is given in the form of a visual presentation on a display of the radio terminal equipment, a sound indication, a vibration, or any combination thereof.

32. The method of claim 29, the method further comprising using a Bluetooth Service Discovery for receiving the battery characteristics of the at least one secondary unit, the Bluetooth Service Discovery comprising:

storing and updating, by the at least one secondary unit, the measured battery characteristics in a Bluetooth Service Discovery Database; and downloading, by the radio terminal equipment, the battery characteristics from the Service Discovery Database.

33. An apparatus, the apparatus being configured to: establish a low-power radio frequency (LPRF) connection between the apparatus and at least one secondary unit; receive measured battery characteristics of at least one secondary unit via the LPRF connection; and provide an indication relating to the battery characteristics of the batteries of the one or more secondary units in the apparatus, wherein the apparatus is configured to use a Bluetooth Service Discovery for receiving the battery characteristics of the at least one secondary unit, the Bluetooth Service Discovery comprising storing and updating, by the at least one secondary unit, the measured battery characteristics in a Bluetooth Service Discovery Database; and downloading, by the apparatus, the battery characteristics from the Service Discovery Database.

34. The apparatus of claim 33, wherein the indication relating to the battery characteristics comprises data on the battery energy level, the battery status, duration of the battery or recharging times.

35. The apparatus of claim 33, wherein the indication relating to the battery characteristics is given in the form of a visual presentation on a display of the radio terminal equipment, a sound indication, a vibration, or any combination thereof.

36. The apparatus of claim 33, wherein the apparatus is configured to use a Bluetooth Inquiry for receiving the measured battery characteristics of the at least one secondary unit, the Bluetooth Inquiry comprising making an inquiry, by the apparatus, for searching the at least one secondary unit; and sending, by the at least one secondary unit, the measured battery characteristics within a respective name string of the secondary unit, when answering to the inquiry of the apparatus.

37. A secondary unit of radio terminal equipment, the secondary unit being configured to: communicate via a low-power radio frequency (LPRF) connection with the radio terminal equipment; and transmit measured battery characteristics of the secondary unit via the LPRF connection to the radio terminal equipment for providing to a user of the radio terminal equipment an indication of one or more of an audible and visual indication of the measured battery characteristic associated with the secondary unit, wherein the secondary unit is configured to send the measured battery characteristics within a respective name string of the secondary unit, when answering to a Bluetooth Inquiry request of the radio terminal equipment.

38. The secondary unit of claim 37, wherein the measured battery characteristics comprise data on the battery energy level, the battery status, duration of the battery or recharging times.

39. The secondary unit of claim 37, wherein the secondary unit is configured to store and update the measured battery characteristics in a Bluetooth Service Discovery Database for enabling downloading, by the radio terminal equipment, the battery characteristics from the Service Discovery Database.

40. A method comprising:

sending a Bluetooth Inquiry;

receiving a Bluetooth Inquiry response from at least one secondary unit, wherein the Bluetooth Inquiry response comprises information relating to battery characteristics of at least one secondary unit measured by said at least one secondary unit, wherein the battery characteristics information is included within a respective name string of the Bluetooth Inquiry response of said at least one secondary unit; and providing a visible or audible indication relating to the battery characteristics of said at least one secondary unit.

* * * * *